United States Patent
Kuo et al.

(10) Patent No.: US 11,676,657 B2
(45) Date of Patent: Jun. 13, 2023

(54) TIME-INTERLEAVING SENSING SCHEME FOR PSEUDO DUAL-PORT MEMORY

(71) Applicant: MEDIATEK INC., Hsin-Chu (TW)

(72) Inventors: Yi-Ping Kuo, Hsinchu (TW); Yi-Te Chiu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/210,521

(22) Filed: Mar. 24, 2021

(65) Prior Publication Data

US 2021/0327500 A1   Oct. 21, 2021

Related U.S. Application Data

(60) Provisional application No. 63/010,715, filed on Apr. 16, 2020.

(51) Int. Cl.
   *G11C 11/419*   (2006.01)

(52) U.S. Cl.
   CPC .................. *G11C 11/419* (2013.01)

(58) Field of Classification Search
   CPC .................................... G11C 11/419
   USPC .......................................... 365/154
   See application file for complete search history.

(56) References Cited

U.S. PATENT DOCUMENTS

| | | | | |
|---|---|---|---|---|
| 6,272,067 B1 * | 8/2001 | Sun | ........... | G11C 7/1012 |
| | | | | 712/32 |
| 8,379,466 B2 * | 2/2013 | Zhang | ........... | G11C 29/83 |
| | | | | 365/207 |
| 10,026,472 B2 | 7/2018 | Ishii | | |
| 2003/0231527 A1 * | 12/2003 | Nakase | ........... | G11C 29/023 |
| | | | | 365/196 |
| 2007/0109909 A1 | 5/2007 | Jung | | |
| 2008/0155172 A1 * | 6/2008 | Li | ........... | G06F 9/268 |
| | | | | 711/E12.083 |
| 2008/0181040 A1 | 7/2008 | Huang | | |
| 2009/0129173 A1 | 5/2009 | Kajiyama | | |

(Continued)

FOREIGN PATENT DOCUMENTS

JP          4673008 B2      4/2011

OTHER PUBLICATIONS

Yuichiro Ishii et al., A 5.92-Mb/mm2 28-nm Pseudo 2-Read/Write Dual-port SRAM using Double Pumping Circuitry, IEEE Asian Solid-State Circuits Conference, Nov. 7-9, 2016/Toyama, Japan, pp. 17-20, XP033061202.

*Primary Examiner* — Sung Il Cho
(74) *Attorney, Agent, or Firm* — Winston Hsu

(57) ABSTRACT

The present invention provides a pseudo dual-port memory. The pseudo dual-port memory includes a single-port memory, a multiplexer, a timing control circuit and an output circuit. The multiplexer is configured to sequentially output a first address and a second address to the single-port memory. The output circuit is configured to receive output data from the single-port memory to generate a first reading result corresponding to the first address and a second reading result corresponding to the second address. The output circuit includes a first sense amplifier and a second sense amplifier, wherein the first sense amplifier receives the output data to generate first data serving as the first reading result according to a first control signal, and the second sense amplifier receives the output data to generate second data serving as the second reading result according to a second control signal.

12 Claims, 6 Drawing Sheets

(56) References Cited

U.S. PATENT DOCUMENTS

| | | | | |
|---|---|---|---|---|
| 2012/0188838 A1* | 7/2012 | Cheng | ............... | G11C 8/14 |
| | | | | 365/230.06 |
| 2012/0224435 A1 | 9/2012 | Nukaraju | | |
| 2014/0177323 A1* | 6/2014 | Hegde | ............... | G11C 11/419 |
| | | | | 365/154 |
| 2014/0204683 A1* | 7/2014 | Sahu | ............... | G11C 7/08 |
| | | | | 365/189.11 |
| 2015/0357028 A1* | 12/2015 | Huang | ............... | G11C 11/419 |
| | | | | 365/154 |
| 2020/0388327 A1* | 12/2020 | Nguyen | ............... | G11C 11/417 |

* cited by examiner

TIME-INTERLEAVING SENSING SCHEME FOR PSEUDO DUAL-PORT MEMORY

CROSS REFERENCE TO RELATED APPLICATIONS

This application claims the priority of U.S. Provisional Application No. 63/010,715, filed on Apr. 16, 2020, which is included herein by reference in its entirety.

BACKGROUND

A dual-port memory handles two operations such as two read operations within a single clock cycle. A dual-port memory typically includes two ports operating with an array of memory cells, which may be simultaneously accessed from both ports. In order to reduce the area occupied by memory, a pseudo dual-port memory is used. The pseudo dual-port memory is designed to use a time-interleaving mechanism to perform two operations upon the single-port memory within a single clock cycle. For example, in a clock cycle, the pseudo dual-port memory may perform a first read operation, and then, perform a second read operation.

Taking two read operations of the conventional pseudo dual-port as an example, a sense amplifier is enabled twice within a single clock signal to output two reading results, respectively, and the two reading results are temporarily stored in two latches, respectively. Each latch is controlled by a corresponding control signal to output the reading result in an appropriate time. However, the control signals of the sense amplifier and the two latches may suffer a racing issue.

SUMMARY

It is therefore an objective of the present invention to provide a pseudo dual-port memory, which is more robust and efficient, to solve the above-mentioned problems.

According to one embodiment of the present invention, a pseudo dual-port memory is disclosed. The pseudo dual-port memory comprises a single-port memory, a multiplexer, a timing control circuit and an output circuit. The multiplexer is configured to receive a first address and a second address, and output one of the first address and the second address to the single-port memory. The timing control circuit is configured to generate a multiplexer control signal to control the multiplexer to sequentially output the first address and the second address to the single-port memory. The output circuit is configured to receive output data from the single-port memory to generate a first reading result corresponding to the first address and a second reading result corresponding to the second address. In addition, the output circuit comprises a sense amplifier and a demultiplexer. The sense amplifier is configured to receive the output data from the single-port memory to generate data according to a control signal, wherein the control signal is generated according to a first control signal and a second control signal generated by the timing control circuit. The demultiplexer is configured to output the data to a first latch when the first control signal has an enable state, and output the data to a second latch when the second control signal has the enable state, wherein the data stored in the first latch serves as the first reading result, and the data stored in the second latch serves as the second reading result.

According to another embodiment of the present invention, a pseudo dual-port memory is disclosed. The pseudo dual-port memory comprises a single-port memory, a multiplexer, a timing control circuit and an output circuit. The multiplexer is configured to receive a first address and a second address, and output one of the first address and the second address to the single-port memory. The timing control circuit is configured to generate a multiplexer control signal to control the multiplexer to sequentially output the first address and the second address to the single-port memory. The output circuit is configured to receive output data from the single-port memory to generate a first reading result corresponding to the first address and a second reading result corresponding to the second address. In addition, the output circuit comprises a first sense amplifier and a second sense amplifier. The first sense amplifier is configured to receive the output data from the single-port memory to generate first data to a first latch according to a first control signal, wherein the first data stored in the first latch serves as the first reading result. The second sense amplifier is configured to receive the output data from the single-port memory to generate second data to a second latch according to a second control signal, wherein the second data stored in the second latch serves as the second reading result.

According to another embodiment of the present invention, a control method of a pseudo dual-port memory is disclosed, wherein the pseudo dual-port memory comprises a single-port memory, a multiplexer and an output circuit: The multiplexer is configured to receive a first address and a second address, and output one of the first address and the second address to the single-port memory. The output circuit comprises a first sense amplifier and a second amplifier. The control method comprises the steps of: in a first half of a clock cycle of the pseudo dual-port memory: and controlling the multiplexer to input the first address to the single-port memory; enabling the first sense amplifier to receive output data of the single-port memory to generate first data serving as a first reading result corresponding to the first address; and in a second half of the clock cycle of the pseudo dual-port memory: controlling the multiplexer to input the second address to the single-port memory; and enabling the second sense amplifier to receive the output data of the single-port memory to generate second data serving as a second reading result corresponding to the first address.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
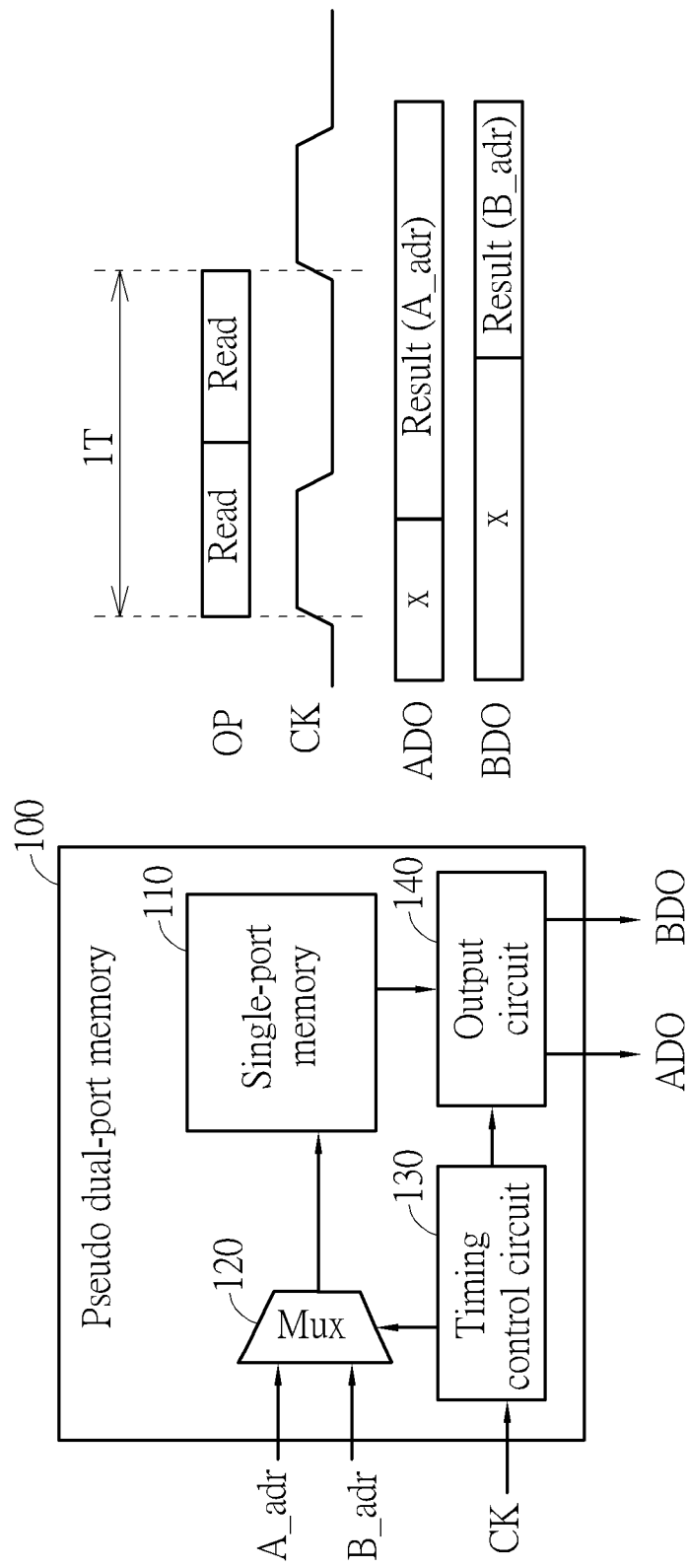
FIG. 1 is a diagram illustrating a pseudo dual-port memory according to one embodiment of the present invention.

FIG. 1 is a diagram illustrating a pseudo dual-port memory 100 according to one embodiment of the present invention. As shown in FIG. 1, the pseudo dual-port memory 100 comprises a single-port memory 110, a multiplexer 120, a timing control circuit 130 and an output circuit 140. The pseudo dual-port memory 100 is designed to use a time-interleaving mechanism to perform two operations upon the single-port memory 110 within a single clock cycle. For example, FIG. 1 shows that two read operations are performed within one cycle (e.g., '1T') of a clock signal CK. In this embodiment, the pseudo dual-port memory 100 is a pseudo dual-port static random access memory (SRAM), that is the single-port memory 110 comprises a plurality of SRAM cells.

In the operation of the pseudo dual-port memory 100, the multiplexer 120 may receive two addresses A_adr and B_adr, and in a first half of a clock cycle, the timing control circuit 130 generates a multiplexer control signal to control the multiplexer 120 to output the address A_adr to the single-port memory 110, for the single-port memory 110 to select one memory cell corresponding to the address A_adr to generate an output data to the output circuit 140, then the output circuit 140 outputs a reading result ADO according to the output data. Then, in a second half of the clock cycle, the timing control circuit 130 generates the multiplexer control signal to control the multiplexer 120 to output the address B_adr to the single-port memory 110, for the single-port memory 110 to select one memory cell corresponding to the address B_adr to generate an output data to the output circuit 140, then the output circuit 140 outputs a reading result BDO according to the output data. By using this time-interleaving mechanism, the pseudo dual-port memory 100 can perform two read operations within the single clock cycle to output two reading results ADO and BDO sequentially.

Figure 2:
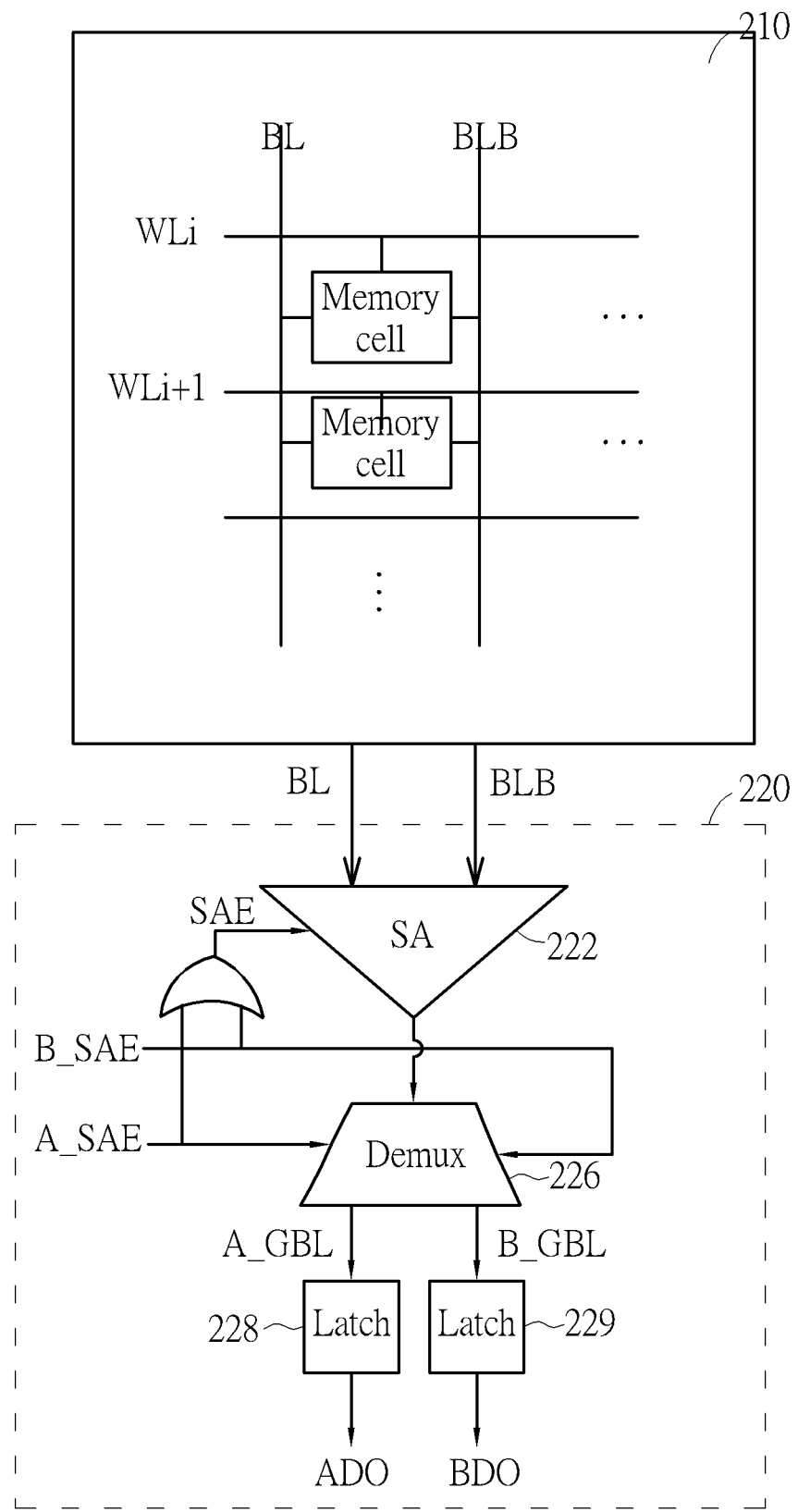
FIG. 2 shows a circuit within part of the single port memory and a circuit within part of the output circuit according to one embodiment of the present invention.

FIG. 2 shows a circuit 210 within part of the single port memory 110 and a circuit 220 within part of the output circuit 140 according to one embodiment of the present invention. As shown in FIG. 2, the single-port memory 110 comprises a memory cell array, each memory cell is used to store one bit. The circuit 210 shows some memory cells belonging to a complementary bit line pair including BL and BLB, and perpendicular to the bit lines are word lines such as $WL_i$, $WL_{i+1}$. The circuit 220 within the output circuit 140 is coupled to one complementary bit line pair such as BL and BLB, and the circuit 220 is configured to get data from the bit lines BL/BLB to generate the two reading results ADO and BDO.

Figure 3:
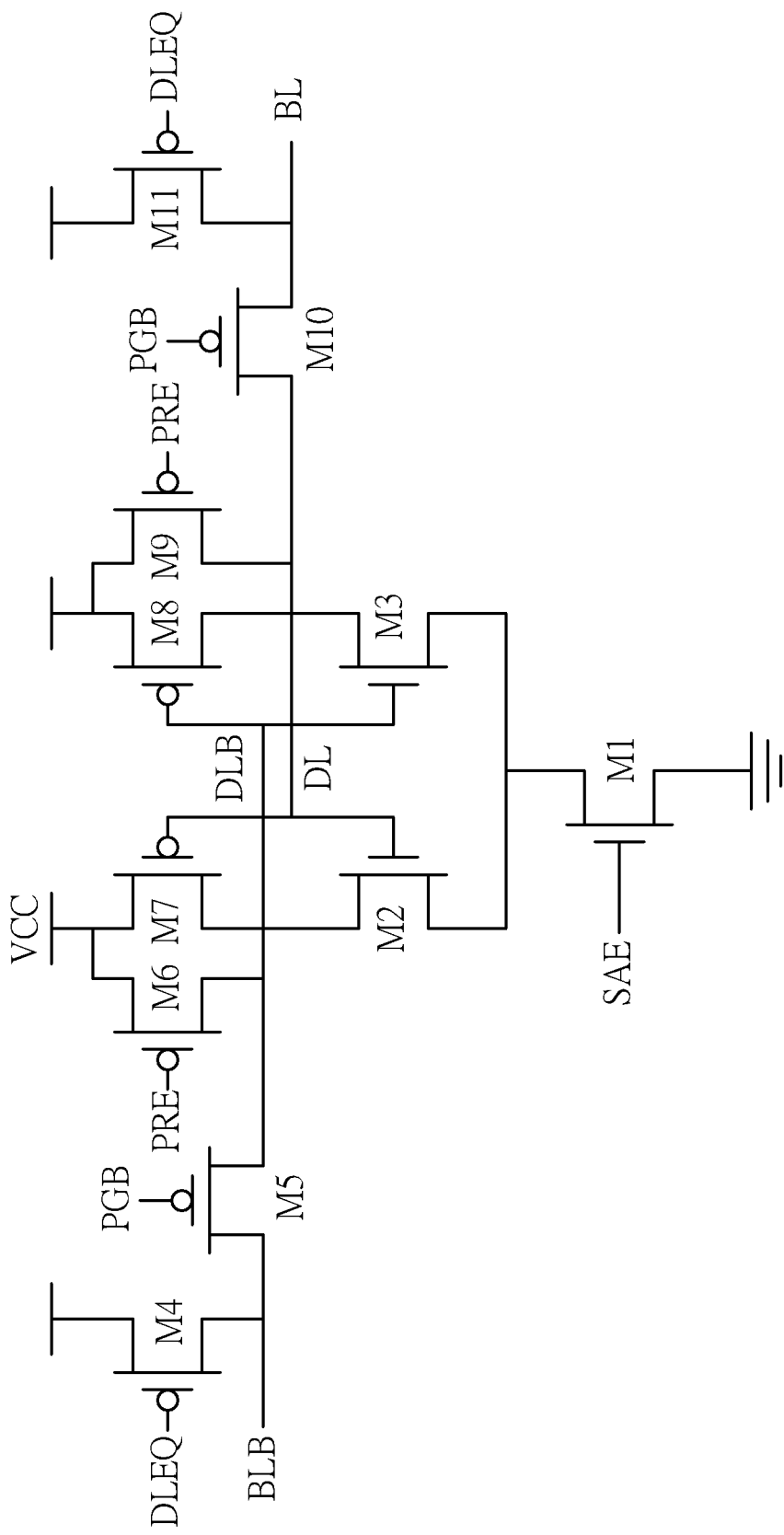
FIG. 3 shows the sense amplifier according to one embodiment of the present invention.
Figure 4:
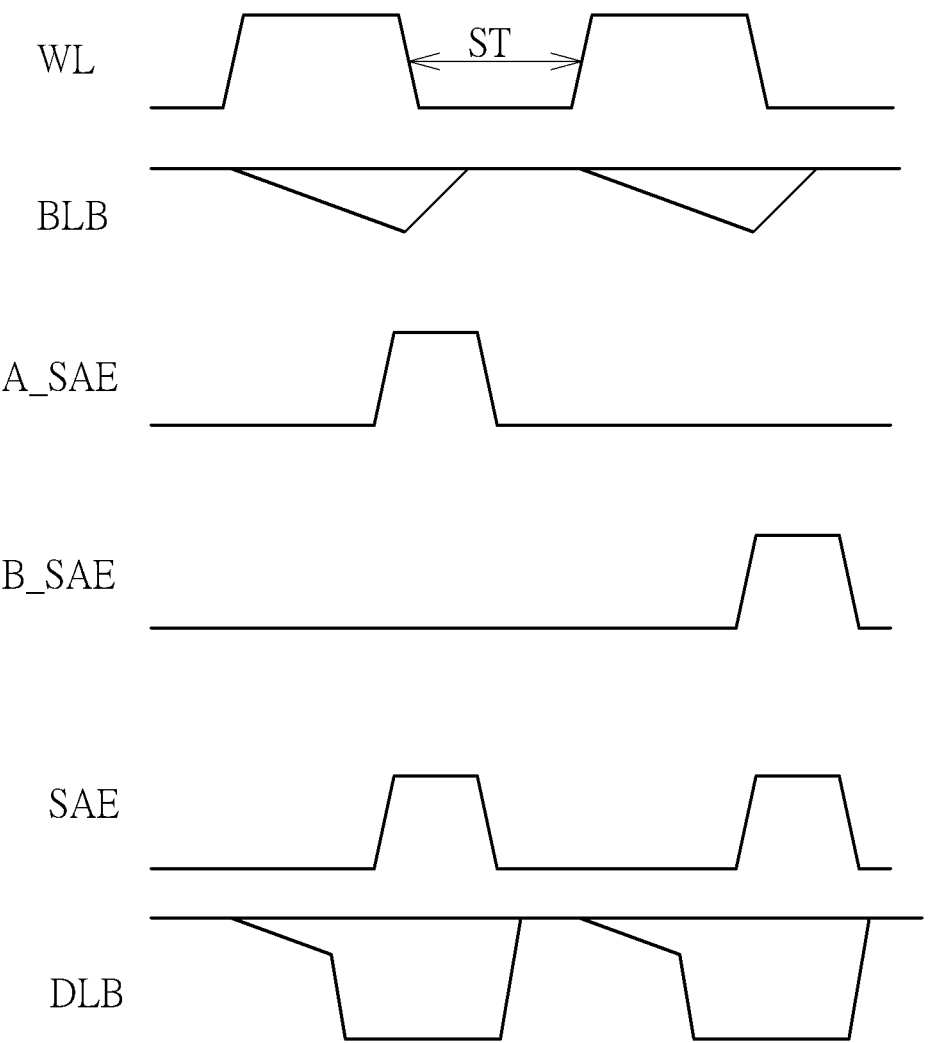
FIG. 4 shows a timing diagram of some signals shown in FIG. 2 and FIG. 3 according to one embodiment of the present invention.

Specifically, the circuit 220 comprises a sense amplifier (SA) 222, a demultiplexer 226, an OR gate and two latches 228 and 229. FIG. 3 shows the sense amplifier 222 according to one embodiment of the present invention, wherein the sense amplifier 220 comprises transistors M1-M11, wherein the transistor M1 is controlled by a control signal SAE, the transistors M4 and M11 are controlled by a signal DLEQ, the transistors M5 and M10 are controlled by a signal PBG that indicates a read operation when set to logic low, the transistors M6 and M9 are controlled by a pre-charge signal PRE. The sense amplifier 220 is configured to receive signals from the bit lines BL and BLB to generate signals DL and DLB to the following circuit. Because the operation of the sense amplifier 220 is known by a person skilled in the art, the detailed descriptions about the transistors M1-M11 are omitted here. FIG. 4 shows a timing diagram of some signals within the circuit 210 and the circuit 220 according to one embodiment of the present invention. Referring to FIGS. 1-4 together, regarding the operation of the circuit 210 and the circuit 220, the timing control circuit 130 generates a first control signal A_SAE and a second control signal B_SAE to the circuit 220, wherein the first control signal A_SAE is used to control the circuit 220 to generate the reading result ADO corresponding to the first read operation, and the second control signal B_SAE is used to control the circuit 220 to generate the reading result BDO corresponding to the second read operation. In detail, in a first half of a clock cycle, the timing control circuit 130 generates a multiplexer control signal to control the multiplexer 120 to output the address A_adr to the single-port memory 110, and the single-port memory 110 selects one memory cell corresponding to the address A_adr to generate output data at the bit lines BL and BLB. Then, the timing control circuit 130 generates the first control signal A_SAE having the enable state, and the OR gate 224 receives the first control signal A_SAE to generate the control signal SAE having the enable state to control the sense amplifier 222 to generate signals DL and DLB. At this time, the demultiplexer 226 is controlled by the first control signal A_SAE having the enable state to output data A_GBL (i.e., signals DL and DLB) into the latch 228, wherein the data stored in the latch 228 serves as the reading result ADO. Then, in a second half of a clock cycle, the timing control circuit 130 generates the multiplexer control signal to control the multiplexer 120 to output the address B_adr to the single-port memory 110, and the single-port memory 110 selects one memory cell corresponding to the address B_adr to generate output data at the bit lines BL and BLB. Then, the timing control circuit 130 generates the second control signal B_SAE having the enable state, and the OR gate 224 receives the second control signal B_SAE to generate the control signal SAE having the enable state to control the sense amplifier 222 to generate signals DL and DLB. At this time, the demultiplexer 226 is controlled by the second control signal B_SAE having the enable state to output data B_GBL (i.e., signals DL and DLB) into the latch 229, wherein the data stored in the latch 229 serves as the reading result BDO.

In light of above, because only the first control signal A_SAE and the second control signal B_SAE are used to control the sense amplifier 222 and the demultiplexer 226, this new design of the circuit 220 does not have racing issue occurred in the previous design.

Figure 5:
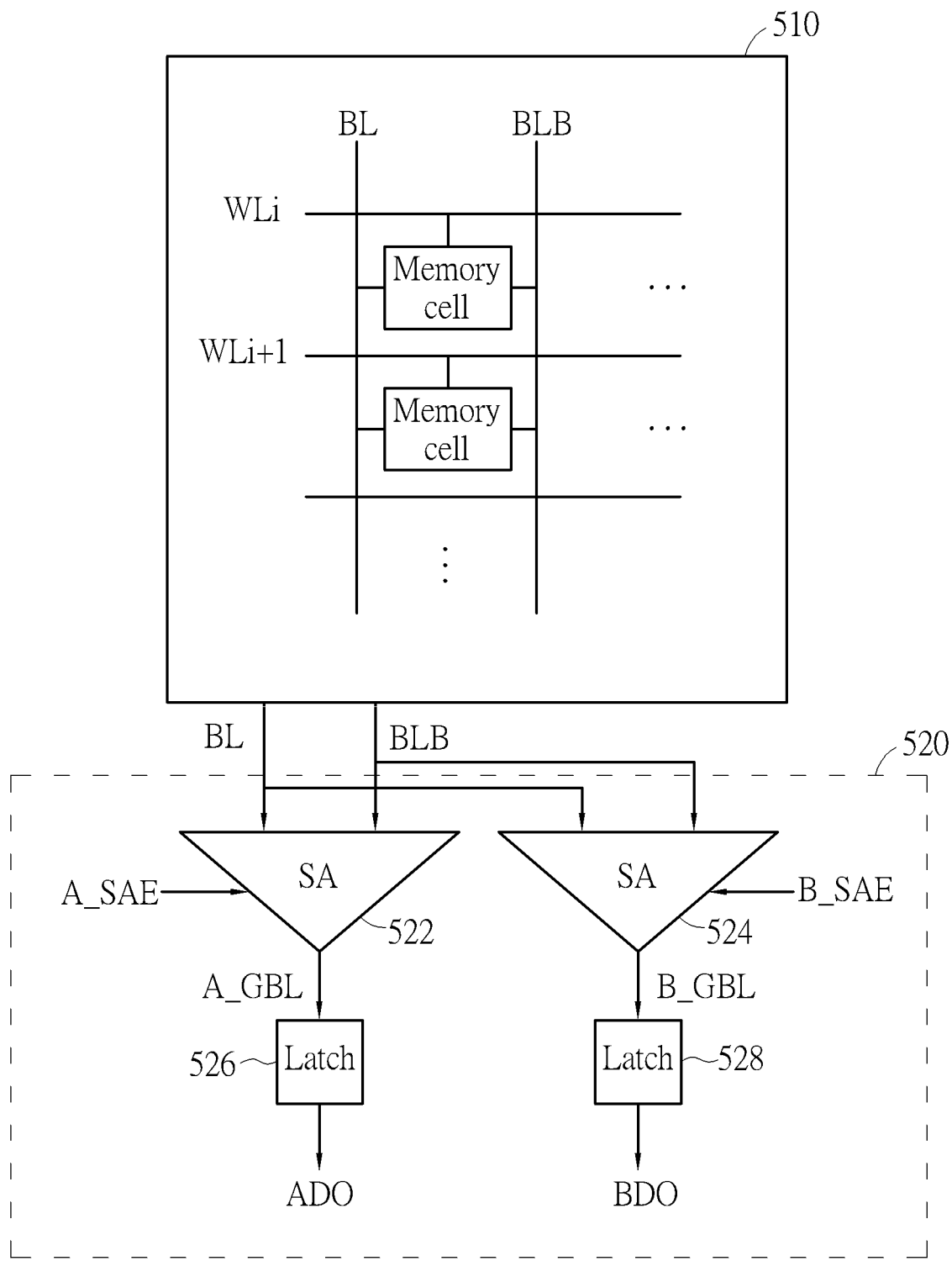
FIG. 5 shows a circuit within part of the single port memory and a circuit within part of the output circuit according to another embodiment of the present invention.

In the embodiment shown in FIG. 2, however, the timing is dominated by the pre-charging of the signal DL/DLB, so the efficiency may be influenced. Specifically, the B-port is triggered after the signal DLB is in pre-charging, so a larger setup time (i.e., 'ST' shown in FIG. 4) is required from A-port to B-port, where the A-port indicates the read operation corresponding to the first half of the clock cycle, and the B-port indicates the read operation corresponding to the second half of the clock cycle. To overcome this problem, FIG. 5 shows a circuit 510 within part of the single port memory 110 and a circuit 520 within part of the output circuit 140 according to another embodiment of the present invention. As shown in FIG. 5, the single-port memory 110 comprises a memory cell array, each memory cell is used to store one bit. The circuit 510 shows some memory cells belonging to a complementary bit line pair including BL and BLB, and perpendicular to the bit lines are word lines such as $WL_i$, $WL_{i+1}$. The circuit 520 within the output circuit 140 is coupled to one complementary bit line pair such as BL and BLB, and the circuit 520 is configured to get data from the bit lines BL/BLB to generate the two reading results ADO and BDO.

Figure 6:
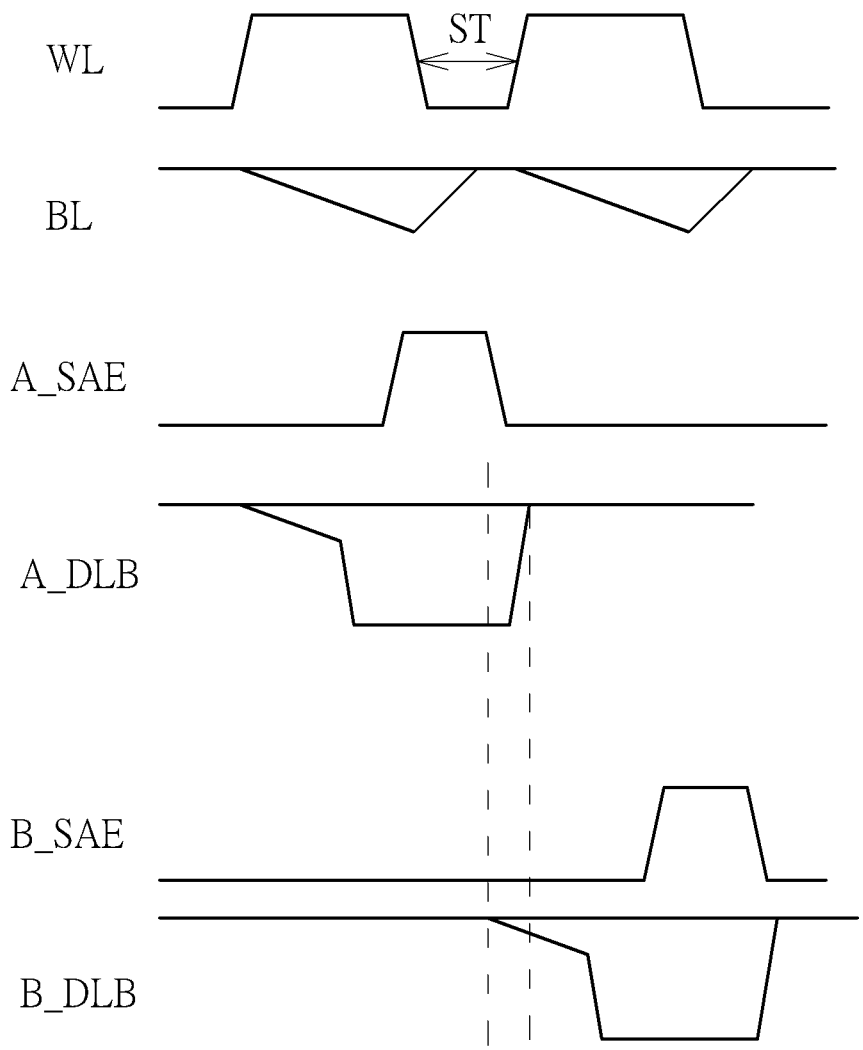
FIG. 6 shows a timing diagram of some signals shown in FIG. 5 and FIG. 3 according to one embodiment of the present invention.

Specifically, the circuit 520 comprises two sense amplifiers 522 and 524, and two latches 526 and 528, wherein the each of the sense amplifiers 522 and 524 may have the structure shown in FIG. 3. FIG. 6 shows a timing diagram of some signals within the circuit 510 and the circuit 520. Referring to FIGS. 1,5 and 6 together, regarding the operation of the circuit 510 and the circuit 520, in a first half of a clock cycle, the timing control circuit 130 generates a multiplexer control signal to control the multiplexer 120 to output the address A_adr to the single-port memory 110, and the single-port memory 110 selects one memory cell corresponding to the address A_adr to generate output data at the bit lines BL and BLB. Then, the timing control circuit 130 generates the first control signal A_SAE having the enable state to control the sense amplifier 522 to generate data A_GBL (i.e., the signals DL and DLB, 'A_GLB' shown in FIG. 6) to the latch 526, wherein the data stored in the latch 526 serves as the reading result ADO; meanwhile, the second control signal B_SAE does not have the enable state, so that the sense amplifier 524 does not output any valid data when the sense amplifier 522 is enabled. Then, in a second half of the clock cycle, the timing control circuit 130 generates the multiplexer control signal to control the multiplexer 120 to output the address B_adr to the single-port memory 110, and the single-port memory 110 selects one memory cell corresponding to the address B_adr to generate output data at the bit lines BL and BLB. Then, the timing control circuit 130 generates the second control signal B_SAE having the enable state to control the sense amplifier 524 to generate data B_GBL (i.e., the signals DL and DLB, 'B_GLB' shown in FIG. 6) to the latch 528, wherein the data stored in the latch 528 serves as the reading result BDO; meanwhile, the first control signal A_SAE does not have the enable state, so that the sense amplifier 522 does not output any valid data when the sense amplifier 524 is enabled.

In the embodiment shown in FIG. 5, the timing is dominated by the pre-charging of the bit lines BL/BLB, so the signal of B-port and the signal of A-port can partially overlap as shown in FIG. 6. Therefore, the setup time (i.e. 'ST' shown in FIG. 4) from A-port to B-port is small, and the circuit 520 can operate in a faster speed to have better efficiency.

Briefly summarized, in the pseudo dual-port memory of the present invention, the output circuit is only controlled by two control signals A_SAE and B_SAE to receive the output data from the single-port memory and output two reading results within a single clock cycle. Therefore, the present invention does not suffer the racing issue between many control signals. In one embodiment, two sense amplifiers are designed to output two reading results separately in one clock cycle, to improve the efficiency of the pseudo dual-port memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pseudo dual-port memory, comprising:
a single-port memory;
a multiplexer, configured to receive a first address and a second address, and output one of the first address and the second address to the single-port memory;
a timing control circuit, configured to generate a multiplexer control signal to control the multiplexer to sequentially output the first address and the second address to the single-port memory; and
an output circuit, configured to receive output data from the single-port memory to generate a first reading result corresponding to the first address and a second reading result corresponding to the second address; and the output circuit comprises:
a sense amplifier, configured to receive the output data from the single-port memory to generate data according to a control signal, wherein the control signal is generated according to a first control signal and a second control signal generated by the timing control circuit; and
a demultiplexer, coupled to the sense amplifier, configured to output the data to a first latch when the first control signal has an enable state, and output the data to a second latch when the second control signal has the enable state, wherein the data stored in the first latch serves as the first reading result, and the data stored in the second latch serves as the second reading result;
wherein the demultiplexer is controlled by both the first control signal and the second control signal, and when the first control signal has an enable state, the second control signal does not have the enable state; and when the second control signal has the enable state, the first control signal does not have the enable state.

2. The pseudo dual-port memory of claim 1, wherein when each one of the first control signal and the second control signal has the enable state, the control signal has the enable state to enable the sense amplifier to output the data.

3. The pseudo dual-port memory of claim 1, wherein the pseudo dual-port memory is a pseudo dual-port static random access memory.

4. The pseudo dual-port memory of claim 1, wherein the timing control circuit generates the multiplexer control signal to control the multiplexer to sequentially output the first address and the second address to the single-port memory within a clock cycle, and the timing control circuit further generates the first control signal and the second control signal to sequentially enable the sense amplifier to output the data of the first reading result and the second reading result.

5. The pseudo dual-port memory of claim 4, wherein in a first half of the clock cycle, the timing control circuit generates the multiplexer control signal to control the multiplexer to output the first address to the single-port memory; and in a second half of the clock cycle, the timing control circuit generates the multiplexer control signal to control the multiplexer to output the second address to the single-port memory.

6. The pseudo dual-port memory of claim 4, wherein the timing control circuit generates the first control signal and the second control signal to sequentially enable the sense amplifier to output the data of the first reading result and the second reading result within the clock cycle.

7. The pseudo dual-port memory of claim 6, wherein in a first half of the clock cycle, the timing control circuit generates the multiplexer control signal to control the multiplexer to output the first address to the single-port memory, and the timing control circuit generates the first control signal to enable the sense amplifier to output the data of the first reading result; and in a second half of the clock cycle, the timing control circuit generates the multiplexer control signal to control the multiplexer to output the second address to the single-port memory, and the timing control circuit generates the second control signal to enable the sense amplifier to output the data of the second reading result.

8. The pseudo dual-port memory of claim 1, wherein the output circuit further comprises an OR gate, and the OR gate receives the first control signal and the second control signal to generate the control signal to control the sense amplifier.

9. The pseudo dual-port memory of claim 8, wherein both the OR gate and the demultiplexer receive are directly controlled by the first control signal and the second control signal.

10. The pseudo dual-port memory of claim 1, wherein the control signal is generated by using the first control signal and the second control signal only.

11. The pseudo dual-port memory of claim 1, wherein the demultiplexer is only controlled by the first control signal and the second control signal.

12. The pseudo dual-port memory of claim 1, wherein the sense amplifier and the demultiplexer are only controlled by the first control signal and the second control signal.

* * * * *